United States Patent [19]

Brisson

[11] Patent Number: 5,914,636
[45] Date of Patent: Jun. 22, 1999

[54] BALANCED POWER AUDIO AMPLIFICATION SYSTEM

[76] Inventor: Bruce A. Brisson, 3037 Grass Valley Hwy., Auburn, Calif. 95602

[21] Appl. No.: 08/907,219

[22] Filed: Aug. 6, 1997

[51] Int. Cl.$^6$ ........................................................ H03F 3/68
[52] U.S. Cl. .......................... 330/124 R; 381/28; 381/120
[58] Field of Search ............................... 330/124 R, 295; 381/120, 28, 124, 11

[56] References Cited

U.S. PATENT DOCUMENTS

| | | | |
|---|---|---|---|
| 4,786,878 | 11/1988 | Botti | 330/84 |
| 5,161,198 | 11/1992 | Noble | 330/295 |

*Primary Examiner*—Robert Pascal
*Assistant Examiner*—Patricia Nguyen
*Attorney, Agent, or Firm*—Jill L. Robinson

[57] ABSTRACT

A configuration of audio system components, utilizing standard amplifier components, wherein the audio system remains balanced through the speaker input terminals. For each channel of the system, a preamplifier produces a balanced output signal. Two power amplifiers or similar devices are conventionally configured to accept positive and negative input signals. The negative signal output of the preamplifier is connected to the positive input terminal of one of the power amplifiers, and the positive output signal of the preamplifier is connected to the positive input terminal of the other power amplifier. The negative and ground input terminals of both power amplifiers are connected to system ground. The connections between the preamplifiers and the amplifiers may be effected by a unique cable designed for this purpose. The positive output terminal of one of the power amplifier is connected to positive input terminal of the speaker, while the positive-output terminal of the other power amplifier is connected to the negative input terminal of the speaker. The negative output terminals of each power amplifier "floats", unconnected externally to the speakers.

19 Claims, 4 Drawing Sheets

BALANCED POWER AUDIO AMPLIFICATION SYSTEM

BACKGROUND OF THE INVENTION

1. Field of the Invention

The present invention relates to audio signal transmission and amplification systems, specifically to an improved configuration of an output channel in an audio signal amplification system which increases the power delivered to the speaker and reduces audible noise.

2. Description of Relevant Art

In audio signal transmission and amplification systems it is generally desirable to increase the power of the audio signal that is delivered to the speaker while simultaneously increasing the signal to noise ratio. Noise and signal distortion can be introduced by a variety of sources including the system ground and environmental factors.

Sophisticated audio systems often use components that produce a so-called "balanced" signal to increase power while at the same time reducing or eliminating noise and distortion. In balanced systems, the original audio signal is used to create two signals which are substantially identical to the original audio signal but which are 180° out-of-phase with each other. The phases may be used together to produce an amplified signal that is a function of the difference in the amplitude of the two phases. The amplified signal is thus effectively independent of the system ground and any noise or distortions introduced by the system ground: the quality of the amplified signal depends only on the relationship of the out-of-phase signals to each other. Therefore, noise is reduced or eliminated in a balanced system since only the signal components that are opposite each other in the two signals are fully amplified. Common-mode signals, which may be caused by environmental factors, appear equally and with the same polarity on both out-of-phase signals, and are eliminated completely in an ideal balanced system because such common-mode signals have no effect on the difference in amplitude between the out-of-phase signals. Furthermore, if noise or distortion appears on only one of the out-of-phase signals, the magnitude of the noise or distortion is reduced, as it is not fully reflected in the difference between the signals. Thus the use of balanced signals results in an increase in the signal-to-noise ratio.

Audio signal transmission systems have usually been "balanced" through the power amplifier, such that the preamplifier produces the balanced signals which are then amplified by the power amplifiers. In standard systems the connections between the power amplifiers and the speaker have been not been balanced. The positive and negative output terminals of the power amplifiers are simply connected to the positive and negative input terminals, respectively, of the speakers. Some high-end amplifiers have been balanced through the speakers by using connections internal to the amplifiers; however, these amplifiers are expensive, and are non-standard components.

One method that has been used in some systems to increase power at the speaker using standard components is known as "bridging". In bridging, same polarity output terminals of two power amplifiers are connected to each other, and the terminals of one such power amplifier is connected to the positive and negative input terminals of the speaker, which effectively results in the output signals of the two power amplifiers to be additively applied to the speaker. While this method does increase the power delivered to the speaker, it does not eliminate noise, and the input signal to the speakers is dependent upon system ground.

SUMMARY OF THE INVENTION

In view of the foregoing, the principal objects of the present invention are (a) a new configuration of audio system components, utilizing standard amplifier components and unique audio cables, such that the audio system remains balanced through the speaker input terminals, thus reducing noise and increasing the power delivered to the speakers; and (b) a connection apparatus for effecting such configuration.

According to the present invention, for each channel of the system, a preamplifier or similar device produces a balanced output signal at the preamplifier output terminals. Each channel requires two power amplifiers or similar devices, which are conventionally configured at their inputs to accept positive and negative input signals and system ground. The preamplifier and the power amplifiers are configured to cause the negative signal output of the preamplifier to be connected to the positive input terminal of one of the power amplifiers, and the positive output signal of the preamplifier to be connected to the positive input terminal of the other power amplifier. The negative and ground input terminals of both power amplifiers are connected to system ground.

This connection may be achieved using a unique connection cable having input connectors suitable for connection to the preamplifier output connectors and two sets of output connectors each of which is suitable for connection to the input connectors of a power amplifier, and which effects the appropriate connections, as described above, between the terminals positive, negative and ground terminals, which are housed in the connectors.

The output connectors of the each of the power amplifiers may also be conventionally configured, comprising positive and negative output terminals, and may be housed in conventional connectors. The speaker input terminals may be conventionally configured, with positive and negative input terminals, and also may be housed in conventional connectors. The positive output terminal of one of the power amplifier is connected to positive input terminal of the speaker, while the positive input terminal of the other power amplifier is connected to the negative input terminal of the speaker. The negative output terminals of each power amplifier "floats", unconnected externally to the speakers. The connections described may also be effected by a cable designed for this purpose.

As a result of this configuration, a balanced signal is delivered to the speaker inputs, significantly increasing the power delivered to the speaker, using conventional amplifier components and reducing system noise.

DETAILED DESCRIPTION OF THE DRAWINGS

Figure 1:
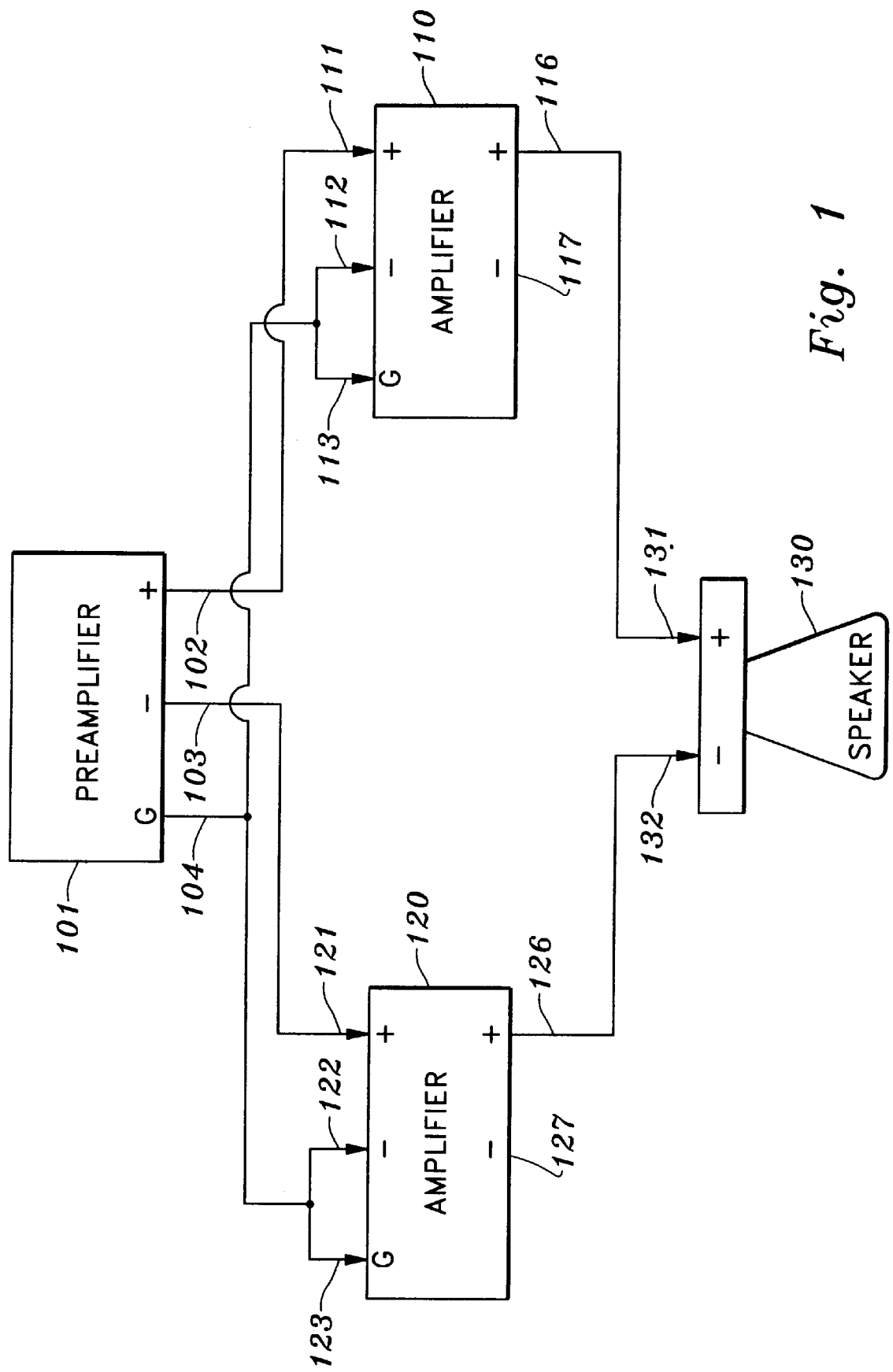
FIG. 1 is a schematic representation of one channel of the audio system configuration of the present invention.

FIG. 1 shows the configuration of one channel of the system according to the present invention. Preamplifier 101 is suitable for producing a balanced output signal of substantially identical signals which are 180° out of phase, at its positive and negative output terminals 102, 103. It should be noted that the preamplifier is acting as a source of a balanced output signal, and any source of balanced output signals may be used in its place. The positive output terminal 102 of the preamplifier 101 is connected to the positive input terminal 111 of amplifier 110. The negative output terminal 103 of preamplifier 101 is connected to the positive input terminal 121 of amplifier 120. The ground output terminal 104 of the preamplifier 101 is connected to the negative input terminals 112, 122 and the ground input terminals 113, 123 of the amplifiers 110, 120. The connection may be effected by a specialized cable (not shown), as described in the text associated with FIGS. 2 and 3. It should be noted that although it is advantageous to effect the connection of the negative input terminals 112, 122 and ground input terminals 113, 123 to system ground by way of a specialized cable so that conventional amplifiers may be used, it would also be possible to make such connections within the amplifiers themselves.

Each amplifier is suitable for producing an output signal from the signal applied at the amplifier input terminals. The amplifiers may be the left and right channels conventional stereo amplifiers, two mono amplifiers or any similar audio system components. Each amplifier 110, 120 includes positive and negative output terminals 116, 126, 117, 127. According to the present invention, the positive output terminal 116 of amplifier 110 is connected to the positive input terminal 131 of speaker 130, and the positive output terminal 126 of amplifier 120 is connected to the negative input terminal 132 of speaker 130. The connections between the amplifiers and the speakers may be effected by a second cable (not shown), as described in FIGS. 2 and 4.

With the connections described, and a balanced signal produced by the preamplifier 101, each amplifier 110, 120 will generate a signal based upon one component of a balanced signal and system ground; thus, the signals at the positive output terminals 116, 126 of the amplifiers 110, 120 will form a balanced signal, and the advantages of a balanced signal are carried through to the speaker 130 output.

Figure 2:
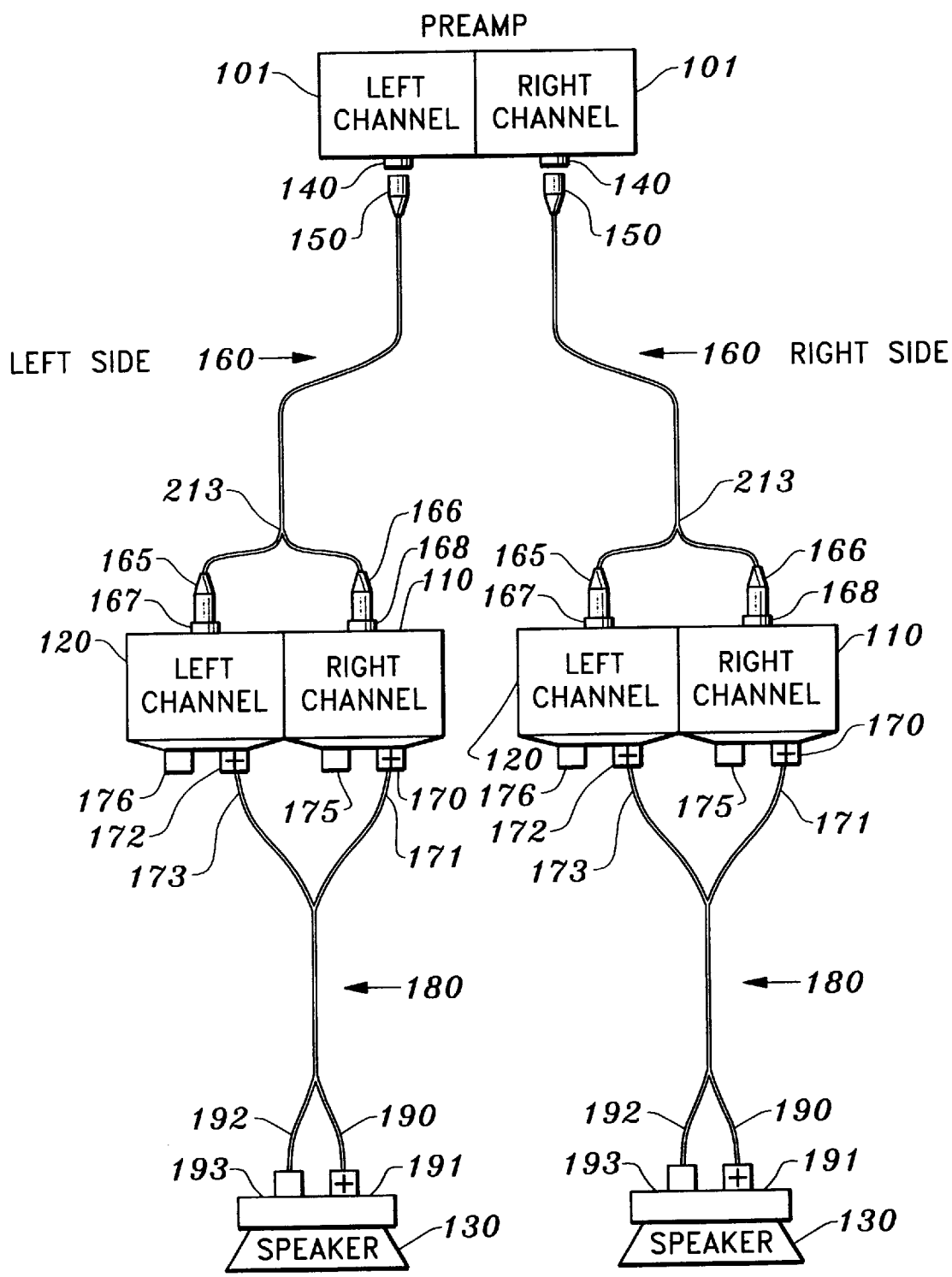
FIG. 2 is a representation of a two-channel audio system configured in accordance with the present invention.

FIG. 2 shows a two-channel configuration of an audio system in accordance with the present invention. The following description is of either channel of the audio system. The positive, negative and ground output terminals (not shown) of the preamplifier (or similar device) 101 are incorporated in an output connector (or connectors) 140. It should be noted that the connectors conventionally incorporate positive, negative and ground terminals. Persons of ordinary skill in the art will recognize that connectors generally may be designed in a variety of ways and may include one or more of the terminals that effect the electrical connections.

A specialized first cable 160 effects the connection between the preamplifier 101 and the amplifiers (or similar devices) 110, 120. The cable has an input connector 150 at one end of the cable and two output connectors 165, 166 at the opposite end of the cable 160. The input connector 150 is suitable for connecting with the output connector 140. The conductors (not shown) comprising the cable 160 may be of any configuration suitable for audio cables including twisted pair, untwisted, multistrand wires or coaxial cable. The cable divides at a point 213, near the output connectors 165, 166 such that one output connector 166 may be connected to the input connector 168 of the amplifier 110, and the second output connector 165 may be connected to the input connector 167 of the amplifier 120.

The two output connectors 165, 166 may be of any design suitable for connecting to the input connectors 167, 168 of the amplifiers 110, 120. As further shown in more detail in FIG. 3, the internal conductors of the cable are also divided at point 213 and are configured to implement the connections between the preamplifier 101 and the amplifiers 110, 120 shown in FIG. 1.

Figure 4:
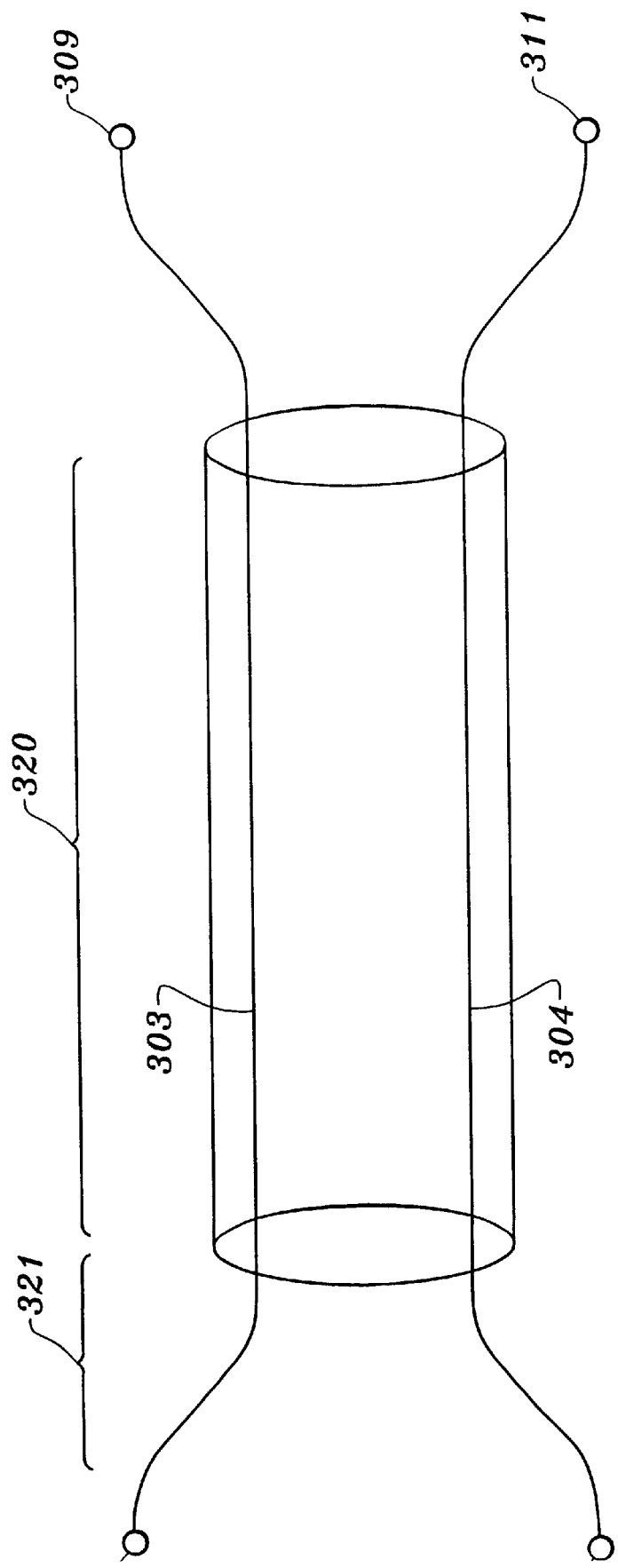
FIG. 4 is a schematic representation of a cable suitable for connecting the amplifier components to the speaker of one channel, in accordance with the present invention.

Each of the amplifiers 110, 120 has an output connector 170, 172 associated with the positive output terminal and an output connector 175, 176 associated with the negative output terminal all of which may be of any suitable design. A second cable 180, includes two input connectors 171, 173 suitable for connecting with the output connectors 170, 172 of the amplifiers associated with each amplifier's positive terminals. The cable 180 is divided such that its input connectors 171, 173 may connect to the output connectors 170, 172 of the amplifiers 110, 120. The conductors (not shown) comprising the cable 180 may be of any configuration suitable for audio cables including twisted pair, untwisted, multistrand wires or coaxial cable, and, as shown in more detail in FIG. 4, are configured in association with the input connectors 171, 173 and output connectors 190, 192 to effect the connections shown in FIG. 1 between the amplifiers 110, 120 and the speaker 130. The output connectors 190, 192 are designed to connect to the input connectors 191, 193 of speaker 130.

Figure 3:
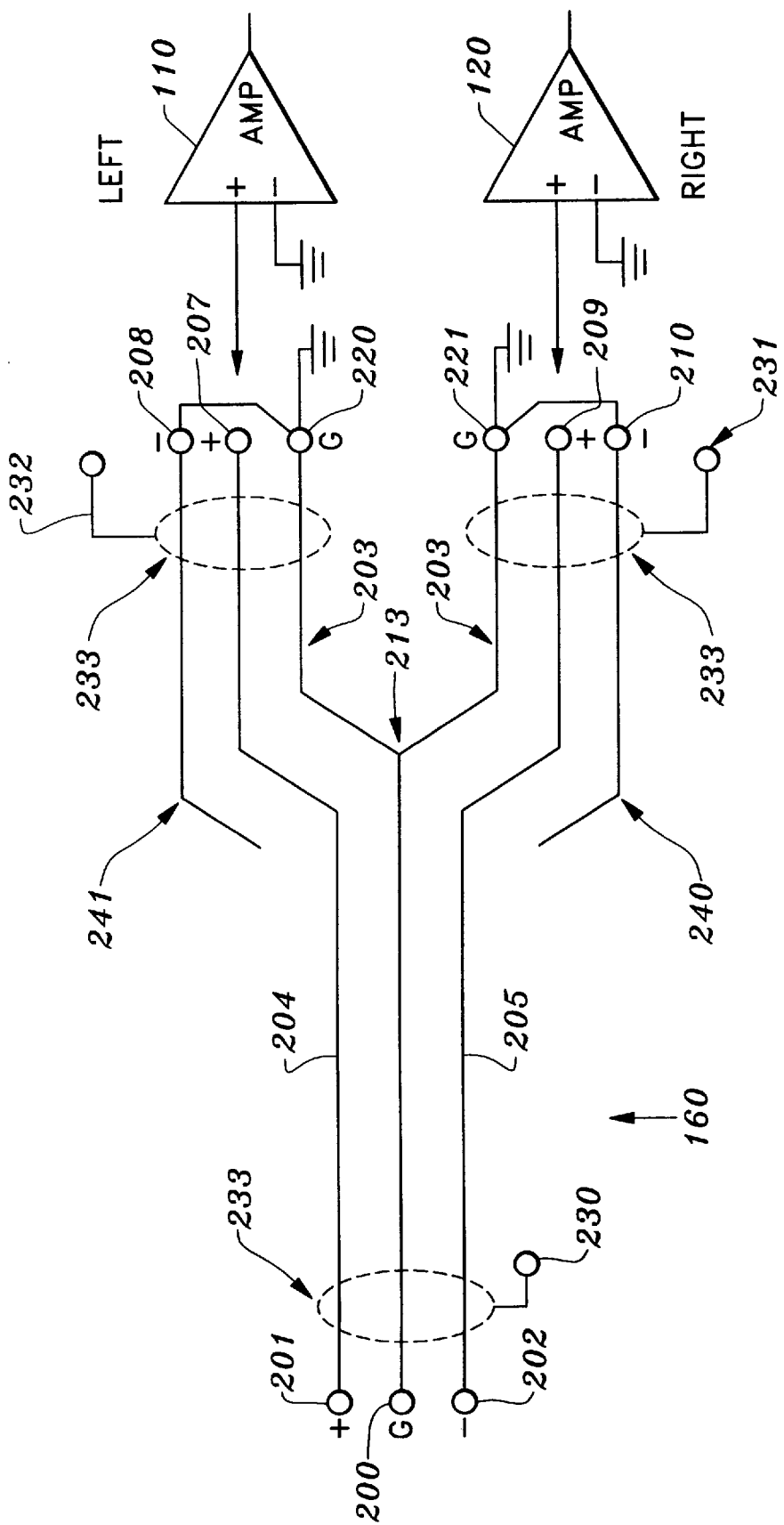
FIG. 3 is a schematic representation of a cable suitable for connecting the preamplifier components to the amplifiers of one channel, in accordance with the present invention.

FIG. 3 shows a schematic representation of cable 160 suitable for connecting the preamplifier components to the amplifiers 110, 120 in one channel according to the present invention. The input connector 150 (shown in FIG. 2) includes input terminals for positive 201, negative 202 and system ground 200. In certain audio applications, the equipment chassises are grounded separately from the circuits. In those applications, the input and output cable connectors would also include terminals for the chassis ground 230, 231, 232, in addition to those for the circuit ground 200, 207, 209. Another common configuration ties the terminals (or their equivalent) for chassis ground 230, 231, 232 to the terminals for circuit ground 200, 220, 221, usually within the connectors, to eliminate the separate grounding in the system.

Each of the input terminals is connected to an associated conductor 203, 204, 205, 233. The conductor for chassis ground is often an external braid 233 (shown schematically) on the cable. As stated above, the conductors 203, 204, 205, 233 may be configured in any manner usual for audio cables, including twisted pair, untwisted, single or multistrand wires or coaxial cable.

The conductors are grouped into a single cable package for some length of the cable, but the cable package is divided into two cable packages at a point 213 (also shown in FIG. 2), each containing at least two conductors. The conductor 204 associated with the positive input terminal 201, appears in one of the two packages and is connected to the positive terminal 207 of the output connector 166 (shown in FIG. 2). The conductor 205 associated with the negative input terminal appears in the other package and is connected to the positive terminal 209 of the second output connector 165 (shown in FIG. 2).

The second conductor 203 in each of the two packages is circuit ground, and the conductor 203 is electrically connected to the negative output terminals 208, 210 and to the ground output terminals 220, 221 of each of the output connectors 165, 166 (shown in FIG. 2). If a separate chassis ground is used, the conductor associated with such chassis ground will be electrically connected to each of the chassis ground terminals 230, 231, 232. Alternatively, if a single ground is used, as described above, the conductor for chassis ground 233 may be electrically connected to circuit ground, usually by tying each terminal for chassis ground 231, 232 to the connected terminals for circuit ground 221, 220 and negative input 208, 210.

In practice standard cable often includes a third conductor. Therefore, for manufacturing ease, each of the two packages may contain a conductor 240, 241 that is connected to the negative input terminal 208, 210. These conductors 240, 241 are left unconnected near the point of division 213. As persons of ordinary skill in the art will appreciate, these conductors 240, 241 may be eliminated or shortened without any effect on the cable function.

FIG. 4 shows a schematic representation of a cable suitable for connecting the amplifier components to the speaker in one channel according to the present invention. The connector includes two input terminals 301, 302. As noted in FIG. 2, the connectors may be of a standard connector of any type generally used for audio cable applications and suitable for connecting to the positive output terminals of power amplifiers. Each of the input terminals is connected to an associated conductor 303, 304. The conductors 303, 304 may be configured in any manner usual for audio cables, including twisted pair, untwisted, single or multistrand wires or coaxial cable. The two input terminals 301,302 must be configured to be able to connect to the positive output terminals of two amplifiers 110, 120 as described in connection with FIG. 2. Therefore, although the two conductors are preferably packaged together for most of the length of the cable 320, the conductors must be separable adjacent to where they are connected to the two input terminals 301, 302 identified as region 321, to allow for the connection to the amplifiers. For most applications a separation of approximately one foot is adequate.

The conductor 304 associated with the first input terminal 302 of the cable is connected to output terminal 311 which is part of output connector 190 (shown in FIG. 2) and is suitable for connecting to the positive input terminal of a speaker. The conductor 303 associated with the second input terminal 301 of the cable is connected to a second output terminal 309 which is part of output connector 192 (shown in FIG. 2) and is suitable for connecting to the negative input of the speaker.

The cables connecting the preamplifier and the power amplifiers and the power amplifiers and the speakers may incorporate noise suppression networks, filters or similar devices. For example, two such networks are described in U.S. Pat. Nos. 4,954,787 and in 5,142,252 (the "'252 Patent"), which are incorporated by reference herein. Such networks are not necessary to achieve a balanced output in an audio system and the advantages thereof, however, if such networks are used, as would be evident to those of ordinary skill in the art, they should be configured so that the specific phase and amplitude relationship of the signals is maintained in the system. For example, essentially identical networks of the type shown in the '252 Patent can be used in each of the cables 160, 180, and inductors can be placed in (or to affect) both the positive and negative conductors in each cable. Obviously, it is therefore important to have the values of all network components affecting one signal or channel to be very close to the values of the components affecting the other signal or channel. Thus, precision components, and/or component configurations in such networks are preferable.

While preferred embodiments of the present invention are described above, it is contemplated that various modifications may be made thereto without departing from the spirit and scope of the present invention. For example, while the present invention is directed towards a high fidelity sound system, the benefits of the present invention may be realized anywhere high quality sound reproduction is desired, such as in a recording studio, a professional concert or theater sound reproduction system, or a modem home theater system. Accordingly, it is intended that the embodiments described be considered only as illustrative of the present invention and that the scope thereof should not be limited thereto but be determined by reference to the claims hereinafter provided and their equivalents.

What is claimed is:

1. A cable for use in an amplification system for audio signals comprising:

A positive cable input terminal, a negative cable input terminal, and a ground cable input terminal;

first and second positive cable output terminals, first and second negative cable output terminals, and first and second ground cable output terminals, said positive cable input terminal and negative cable input terminal suitable for electrical coupling with a source of a balanced audio signal and said ground cable input terminal suitable for electrically coupling with system ground, said first positive cable output terminal, first negative cable output terminal and first ground cable output terminal suitable for electrically coupling with positive, negative and ground input terminals, respectively, of a first amplifier, and said second positive cable output terminal, second negative cable output terminal and second ground cable output terminal suitable for electrically coupling with positive, negative and ground input terminals, respectively, of a second amplifier, wherein the first positive cable output terminal is electrically coupled to the positive cable input terminal, the second positive cable output terminal is electrically coupled to the negative cable input terminal, and wherein each of the first and second negative cable output terminals and each of the first and second ground cable output terminals are electrically coupled to the ground cable input terminal.

2. A cable according to claim 1, further comprising a positive conductor effecting the electrical coupling of the positive cable input terminal and the first positive cable output terminal and a negative conductor effecting the electrical coupling of the negative cable input terminal and the second positive cable output terminal.

3. A cable according to claim 2, wherein the positive conductor and the negative conductor are twisted pair conductors.

4. An amplification system for audio signals comprising:

a first amplifier, comprising a positive amplifier input, a negative amplifier input, a ground amplifier input, a positive amplifier output terminal and a negative amplifier output terminal, wherein said negative amplifier input is electrically connected to said ground amplifier input;

a second amplifier, comprising a positive amplifier input terminal, a negative amplifier input terminal, a ground amplifier input terminal, a positive amplifier output terminal and a negative amplifier output terminal, wherein said negative amplifier input terminal is electrically connected to said ground amplifier input terminal; and a source of audio signals comprising a positive output terminal, a negative output terminal and a ground output terminal, wherein an audio signal output of the positive output is one hundred eighty degrees out-of-phase with an audio signal output of the negative output terminal, and wherein the positive output terminal of the source of audio signals is electrically coupled to the positive amplifier input terminal of the first amplifier and the negative output terminal of the source of audio signals is electrically coupled to the positive input terminal of the second amplifier; and the ground output terminal of the source of audio signals is electrically coupled to the negative amplifier input terminals of each of the first and second amplifiers and the ground amplifier input terminals of each of the first and second amplifiers, such that an audio signal output at the positive amplifier output terminal of the first amplifier is one hundred eighty degrees out-of-phase with an audio signal output at the positive amplifier output terminal of the second amplifier.

5. An amplification system according to claim 4, said amplification system further comprising:

a speaker having positive and negative input terminals, wherein said positive input terminal of the speaker is electrically coupled to the positive amplifier output terminal of the first amplifier and the negative input connector of the speaker is electrically coupled to the positive amplifier output terminal of the second amplifier.

6. An amplification system according to claim 5, wherein the negative output terminals of the first and second amplifiers are not electrically coupled to the speaker.

7. An amplification system according to claim 4, wherein the negative amplifier output terminals of the first and second amplifiers are not connected to any external device.

8. A cable for use in an amplification system for audio signals comprising:

a first input means for accepting a first audio signal;

a second input means for accepting a second audio signal, and a third input means for connecting with a system ground;

first cable output means for electrically coupling with a first input terminal of a first amplification means, second cable output means for electrically coupling with a first input terminal of a second amplification means, first negative cable output means for electrically coupling with a second input terminal of the first amplification means, second negative cable output means for electrically coupling with a second input terminal of the second amplification means, first ground cable output means for electrically coupling with a third input terminal of the first amplification means, second ground cable output means for electrically coupling with a third input terminal of the second amplification means, means for electrically connecting the first negative cable output means and the first ground cable output means with a system ground, and means for electrically connecting the second negative cable output means and the second ground cable output means with the system ground.

9. An amplification system for audio signals, said amplification system comprising:

preamplifier means for producing a balanced electrical audio signal at a first and second preamplifier signal output means;

first and second amplifier means for amplifying audio signals, each of said first and second amplifier means comprising a positive, negative and ground signal input means and a positive and negative signal output means;

means for electrically connecting the negative and ground signal input means of the first and second amplifier means to a system ground;

means for electrically connecting the first preamplifier signal output means to the positive signal input means of the first amplifier means, and means for electrically connecting the second preamplifier signal output means to the positive signal input means of the second amplifier means.

10. The amplification system of claim 9, said amplification system further comprising:

speaker means for converting an electrical audio signal into sound, said speaker means further comprising first and second means for accepting an electrical audio signal;

means for electrically connecting the first accepting means to the positive signal output means of the first amplifier means, and means for electrically connecting the second accepting means to the positive signal output means of the second amplifier means.

11. A method of configuring each of two channels of an amplification system for audio signals, each said channel including a source of audio signals having a positive output terminal, a negative output terminal, and a ground output terminal, said source of audio signals capable of producing an audio signal at the positive output terminal of the source of audio signals and producing an audio signal at the negative output terminal of the source of audio signals such that the audio signal at the negative terminal of the source of audio signals is one hundred eighty degrees out-of-phase with the audio signal at the positive terminal of the source of audio signals;

a first amplifier and a second amplifier, each of said amplifiers having a positive input terminal, a negative input terminal, a ground input terminal, a positive output terminal and a negative output terminal; and a speaker having a positive input terminal and a negative input terminal, said method comprising the steps of:

electrically connecting the positive output terminal of the source of audio signals to the positive input terminal of the first amplifier;

electrically connecting the negative output terminal of the source of audio signals to the positive input terminal of the second amplifier;

electrically connecting the negative input terminal and the ground input terminal of each of the first and second amplifiers to system ground;

electrically connecting the positive output terminal of the first amplifier to the positive input terminal of the speaker;

electrically connecting the positive output terminal of the second amplifier to the negative input terminal of the speaker.

12. The method according to claim 11, said method further comprising the steps of:

electrically isolating the negative output terminal of the first amplifier so that the negative output terminal of the first amplifier is free of external electrical connections, and electrically isolating the negative output terminal of the second amplifier so that the negative output terminal of the second amplifier is free of external electrical connections.

13. A cable according to claim 1, further comprising:

a chassis ground input terminal suitable for electrically coupling with chassis ground;

a first and second chassis ground output terminal, each suitable for electrically coupling with a chassis ground of the first and second amplifier; and wherein each of the first and second chassis ground output terminals are electrically coupled to the chassis ground input terminal.

14. An amplification system according to claim 4, wherein:

the first amplifier further comprises a chassis ground input;

the second amplifier further comprises a chassis ground input;

the source of audio signals further comprises a chassis ground output terminal;

wherein the chassis ground output terminal is electrically connected to the chassis ground input of the first and second amplifier.

15. The method according to claim 11, wherein:

the first amplifier further comprises a chassis ground input terminal;

the second amplifier further comprises a chassis ground input terminal;

the source of audio signals further comprises a chassis ground output terminal;

said method additionally including the step of:

electrically connecting each of the chassis ground input terminals of the first and second amplifier to the chassis ground output terminal of the source of audio signals.

16. The amplification system of claim 9, wherein:

the system ground is a circuit ground means.

17. The amplification system of claim 9, wherein:

the system ground is a circuit ground and the system ground is electrically connected to a chassis ground means.

18. The cable of claim 8, wherein:

the system ground is a circuit ground means.

19. The cable of claim 8, wherein:

the system ground is a circuit ground and the system ground is electrically connected to a chassis ground means.

* * * * *